United States Patent
Kobatake

(10) Patent No.: US 8,824,189 B2
(45) Date of Patent: Sep. 2, 2014

(54) SEMICONDUCTOR DEVICE

(75) Inventor: Hiroyuki Kobatake, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 47 days.

(21) Appl. No.: 13/614,694

(22) Filed: Sep. 13, 2012

(65) Prior Publication Data

US 2013/0094279 A1 Apr. 18, 2013

(30) Foreign Application Priority Data

Oct. 14, 2011 (JP) ................... 2011-226611

(51) Int. Cl.
*G11C 11/00* (2006.01)

(52) U.S. Cl.
USPC .......................................... 365/148; 365/158

(58) Field of Classification Search
CPC ............................ G11C 13/0069; G11C 11/16
USPC .................................................. 365/148, 158
See application file for complete search history.

(56) References Cited

U.S. PATENT DOCUMENTS

| | | | |
|---|---|---|---|
| 6,992,920 B2 | 1/2006 | Tamai et al. | |
| 7,639,521 B2 | 12/2009 | Baek et al. | |
| 7,799,702 B1 | 9/2010 | Tanaka | |
| 2008/0247223 A1* | 10/2008 | Inokuchi et al. | 365/158 |
| 2008/0261331 A1* | 10/2008 | Iwata et al. | 438/3 |
| 2008/0293196 A1* | 11/2008 | Rinerson et al. | 438/200 |
| 2008/0308853 A1* | 12/2008 | Sugahara et al. | 257/295 |
| 2010/0271861 A1 | 10/2010 | Kitagawa | |
| 2012/0081950 A1* | 4/2012 | Slaughter | 365/158 |
| 2013/0017627 A1* | 1/2013 | Keshtbod et al. | 438/3 |

FOREIGN PATENT DOCUMENTS

| | | |
|---|---|---|
| JP | 2005-32401 A | 2/2005 |
| JP | 2006-279042 A | 10/2006 |
| JP | 2010-225868 A | 10/2010 |
| JP | 2010-257506 A | 11/2010 |
| JP | 2010-282673 A | 12/2010 |

* cited by examiner

*Primary Examiner* — Michael Tran
(74) *Attorney, Agent, or Firm* — Miles & Stockbridge P.C.

(57) ABSTRACT

A semiconductor device is provided with a lower-layer circuit including a transistor formed over a semiconductor substrate, and a memory cell array formed in an interconnection layer above the semiconductor substrate. Respective memory cells of the memory cell array are provided with a variable resistor element formed in the interconnection layer serving as a memory element. The memory cell array includes a first region directly underneath the memory cells, the first region being a region where a via for electrical coupling with the memory cell is not formed. The lower-layer circuit is disposed in such a way as to overlap at least a part of the first region.

9 Claims, 18 Drawing Sheets

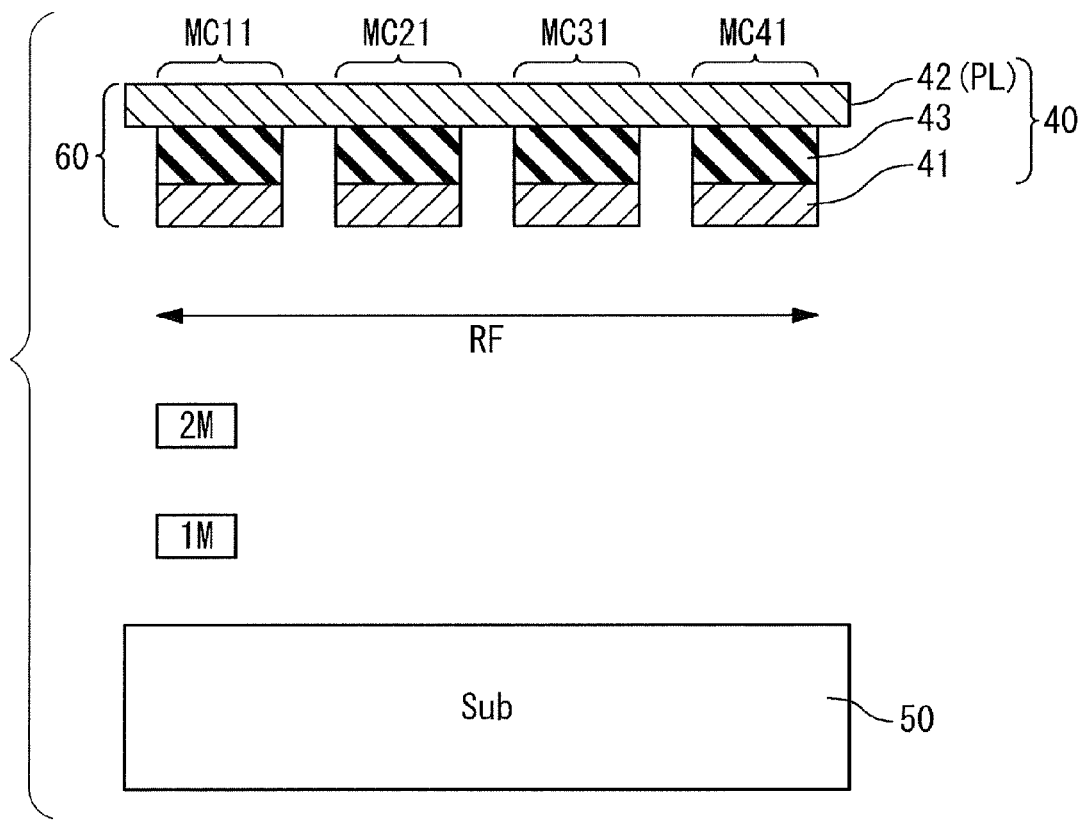

|     | SET  | RESET  | Read  |
|-----|------|--------|-------|
| BL1 | GND  | Vreset | Vread |
| BL2 | open | open   | open  |
| PL1 | Vset | GND    | GND   |

|     | SET     | RESET     | Read  |
|-----|---------|-----------|-------|
| BL1 | GND     | GND       | Vread |
| BL2 | Vset    | Vreset    | Vread |
| PL1 | Vset    | Vreset    | GND   |
| PL2 | 1/2Vset | 1/2Vreset | Vread |

SEMICONDUCTOR DEVICE

CROSS-REFERENCE TO RELATED APPLICATIONS

The disclosure of the Japanese Patent Application No. 2011-226611 filed on Oct. 14, 2011, including the specification, drawings and abstract, is incorporated by reference in its entirety.

BACKGROUND

The present invention relates to a semiconductor device including a variable resistor element.

"A variable resistor element," a resistance value of which is variable by application of a voltage or a current thereto, is well known. A memory using the variable resistor element as a memory element is called "a variable resistance type memory". ReRAM (Resistance Random Access Memory) can be cited as one example of the variable resistance type memories.

FIG. 1 shows a configuration of a memory cell array of ReRAM described in Japanese Unexamined Patent Application Publication No. 2010-257506. As shown in FIG. 1, a plurality of memory cells MCs are disposed in array. The memory cells MCs each are provided with one variable resistor element R cell, and one access transistor (select transistor) AT. The variable resistor element R cell has one end coupled to a plate line PL and the other end coupled to either one of the source/the drain of the access transistor AT. The other of either of the source/the drain of the access transistor AT is coupled to one of bit lines BLs while a gate of the access transistor AT is coupled to one of word lines (access lines) WLs.

FIG. 2 is a sectional view showing a structure of the Memory cell MC shown in FIG. 1. The access transistor AT is formed over a semiconductor substrate 100. Meanwhile, the variable resistor element R cell is formed in an interconnection layer above the semiconductor substrate 100. More specifically, the variable resistor element R cell is made up of a lower electrode 101, an upper electrode (the plate line PL, and a conductor film 103), and an insulator film 102 sandwiched between the lower electrode 101 and the upper electrode. Further, a via construction (104, 105) used for electrical coupling to a diffusion layer of the source/the drain of the access transistor AT over the semiconductor substrate 100 is formed directly underneath the lower electrode 101. That is, the variable resistor element R cell and the access transistor AT, incorporated in the same memory cell MC, are formed so as to be vertically separated from each other, being directly coupled to each other with the via construction (104, 105) interposed therebetween.

The following is well known as the technology related to the variable resistor element.

In Japanese Unexamined Patent Application Publication No. 2010-225868, there is disclosed a nonvolatile memory where variable resistance memory cells are disposed in a matrix configuration. The variable resistance memory cell is formed by stacking a diode material and a variable resistance material one another.

In Japanese Unexamined Patent Application Publication No. 2006-279042, there is disclosed a resistance memory cell. The resistance memory cell incorporates a first electrode plug that is vertically extended, a resistance memory element pattern that is horizontally disposed to cover the upper surface of the first electrode with the minimum width of a part thereof, covering the first electrode, being larger than the diameter of the first electrode plug, and a second electrode disposed over the resistance memory element pattern.

In Japanese Unexamined Patent Application Publication No. 2005-032401, there is disclosed a method for inhibiting occurrence of disturbance. The variable resistor element has one end coupled to a word line and the other end coupled to a bit line. A first word line voltage is applied to a select word line while a second word line voltage is applied to an unselect word line. A first bit line voltage is applied to a select bit line while a second bit line voltage is an unselect bit line. A voltage difference between the first word line voltage and the first bit line voltage is not less than a first voltage difference causing a change in resistance value of the variable resistor element. A voltage difference between the first word line voltage and the second bit line voltage, a voltage difference between the second word line voltage and the first bit line voltage, and a voltage difference between the second word line voltage and the second bit line voltage are each not higher than a second voltage difference causing no change in the resistance value of the variable resistor element.

In. Japanese Unexamined Patent Application Publication No. 2010-282673, there is disclosed a nonvolatile semiconductor memory provided with a three-dimensional memory cell array.

SUMMARY

With respect to a semiconductor device provided with a variable resistor element, reduction in chip area is highly hoped for.

"SUMMARY" is described hereinafter by use of numbers and signs that are used in [DETAILED DESCRIPTION]. These numbers and signs are added in parenthesis in order to clarify a corresponding relationship between description in "WHAT IS CLAIMED IS" and "DETAILED DESCRIPTION." However, it is to be pointed out that these numbers and signs must not be used for interpretation of the technical scope of the invention described in "WHAT IS CLAIMED IS."

In accordance with one aspect of the invention, there is provided a semiconductor device (1). The semiconductor device (1) is provided with a lower-layer circuit (70) including a transistor (71) formed over a semiconductor substrate (50), and a memory cell array (20) formed in an interconnection layer (60) above the semiconductor substrate (50). Respective memory cells (MCs) of the memory cell array (20) are provided with a variable resistor element (40) formed in the interconnection layer (60) serving as a memory element. The memory cell array (20) includes a first region (RF) directly underneath the memory cell, the first region (RF) being region where a via for electrical coupling with the memory cell is not formed. The lower-layer circuit (70) is disposed in such a way as to overlap at least a part of the first region (RF).

With the present invention, reduction in the chip area of a semiconductor device (semiconductor chip) provided with a variable resistor element is achieved.

BRIEF DESCRIPTION OF THE DRAWINGS

FIG. 6 is a sectional view showing a structure of the memory cell array according to the embodiment of the invention;

FIG. 7 is a table for describing an operation of the variable resistance type memory according to the embodiment of the invention;

DETAILED DESCRIPTION

Embodiments of the present invention are described hereinafter with reference to the accompanying drawings.

1. Variable Resistance Type Memory (1-1) Configuration

Figure 3:
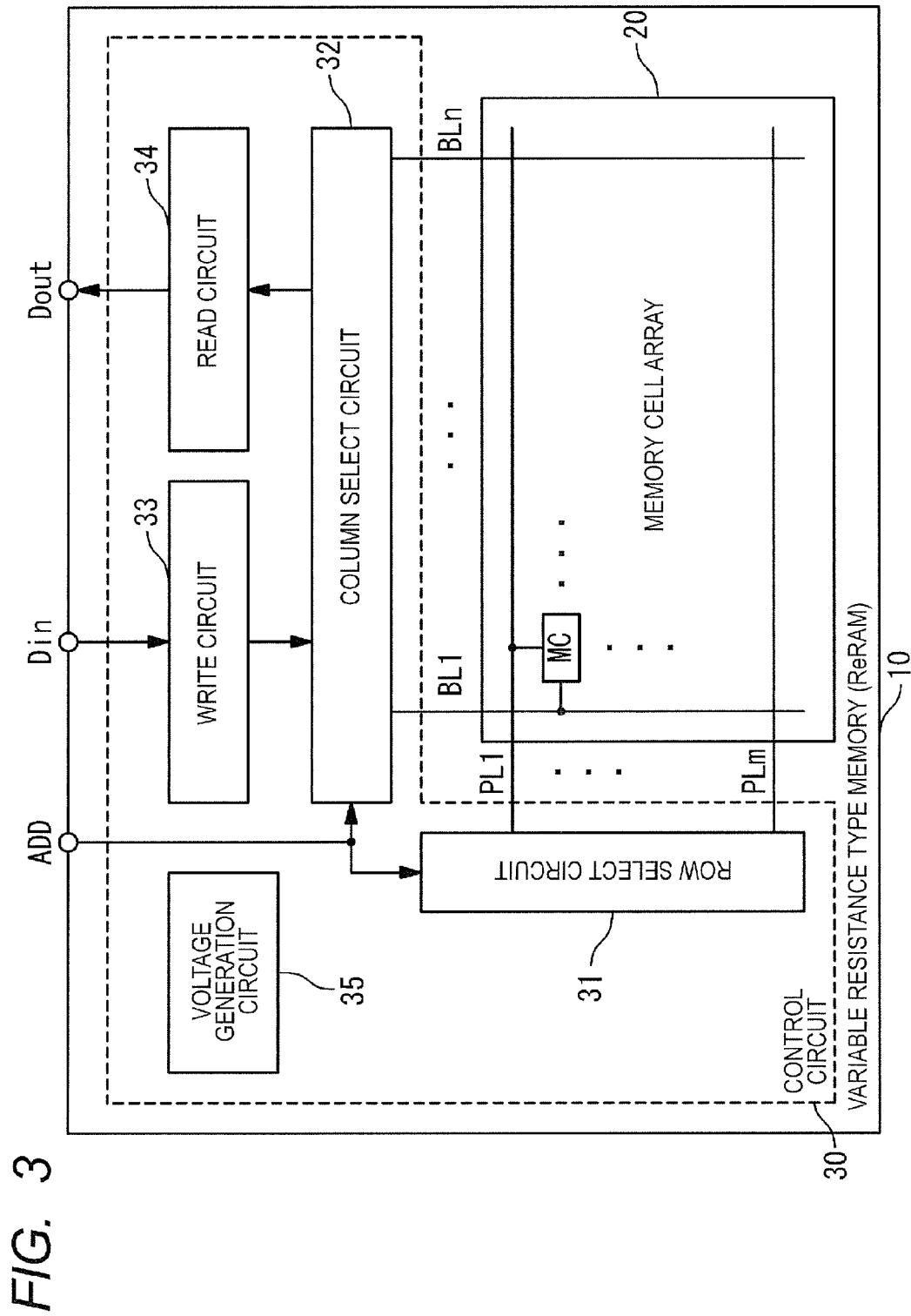
FIG. 3 is a block diagram showing a configuration of a variable resistance type memory according to an embodiment of the invention.

FIG. 3 is a block diagram showing a configuration of a variable resistance type memory 10 according to an embodiment of the invention. As shown in FIG. 3, the variable resistance type memory 10 includes a memory cell array 20, and a control circuit 30.

The memory cell array 20 includes a plurality of memory cells MCs that are disposed in array. More specifically, a plurality of bit lines BLs (BL1 to BLn: n is an integer not less than 2) and a plurality of upper electrode lines PLs (PL1 to PLm: m is an integer not less than 2) are formed in such a way as to intersect each other at respective plural intersections, and the plural memory cells MCs are each disposed at the respective plural intersections.

The control circuit 30 is a circuit for controlling data-writing to the memory cell array 20 and data-reading therefrom. More specifically, the control circuit 30 includes a row select circuit 31, a column select circuit 32, a write circuit 33, a read circuit 34 and a voltage generation circuit 35. The row select circuit 31 applies a voltage to each of the plural upper electrode lines PLs according to an address signal ADD for designating a select memory cell MC, and an operation (writing, reading). The column select circuit 32 applies a voltage to each of the plural bit lines BLs according to the address signal ADD, and the operation (writing, reading). The write circuit 33 receives input data Din written to the select memory cell MC, thereby controlling data-writing. The read circuit 34 controls data-reading, thereby outputting data read out from the select memory cell MC as output data Dout. The voltage generation circuit 35 generates a voltage (further described later on) for use in the data-writing and data-reading.

Figure 4:
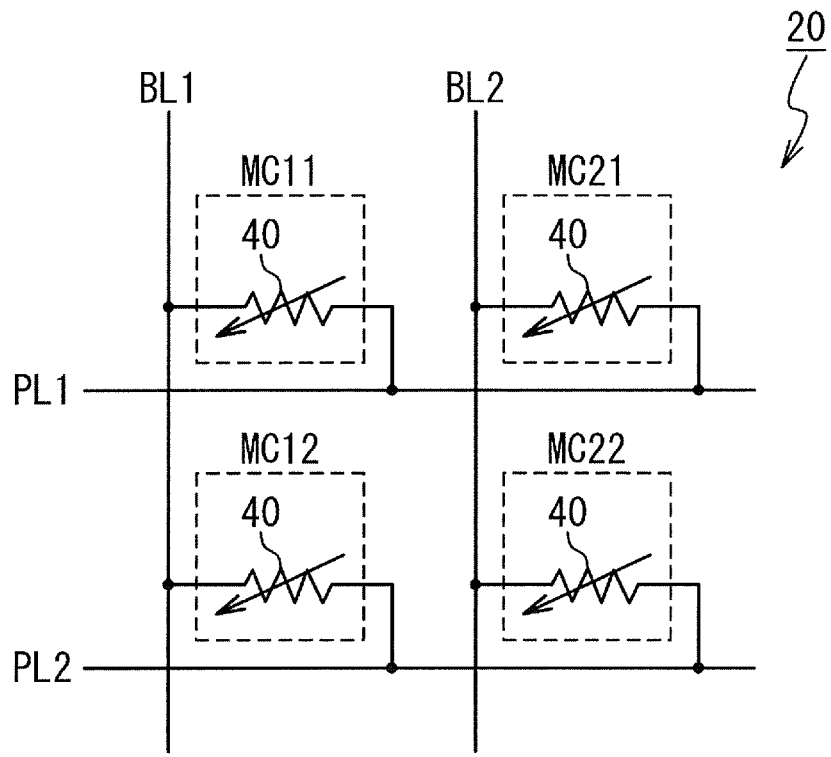
FIG. 4 is a circuit diagram showing a configuration of a memory cell array according to the embodiment of the invention.

FIG. 4 shows a configuration of the memory cell array 20 according to the present embodiment of the invention in more details. In the figure, there are shown four memory cells MCs (MC11, MC12, MC21, MC22). The respective memory cells MCs include a variable resistor element 40 serving as a non-volatile memory element. The variable resistor element 40 is a two-terminal element. A resistance value of the variable resistor element 40 (that is, a value of resistance across those two terminals) is varied by application of a voltage or a current across the two terminals. As shown in FIG. 4, one of the terminals of the variable resistor element 40 is coupled to any one length of the bit lines BLs, and the other of the terminals is coupled to any one length of the upper electrode lines PLs.

Herein attention should be paid to the fact memory cells MCs each are not provided with any element other than the variable resistor element 40 such as a select transistor (an access transistor) and a diode. More specifically, the one of the terminals of the variable resistor element 40 is coupled to the one of the bit lines BLs without another element such as the select transistor and so forth interposed therebetween, and the other of the terminals is coupled to the one of the upper electrode lines PLs without another element such as the select transistor and so forth interposed therebetween.

Figure 5:
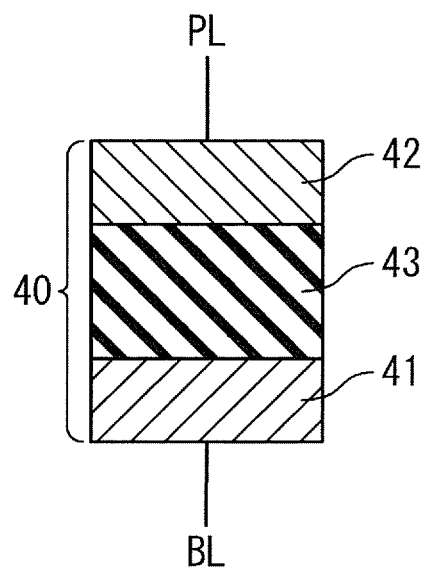
FIG. 5 is a sectional view showing a structure of a variable resistor element according to the embodiment of the invention.

FIG. 5 shows a structure of the variable resistor element 40 according to the present embodiment of the invention. The variable resistor element 40 includes a lower electrode 41, an upper electrode 42, and a switching layer 43 sandwiched between the lower electrode 41 and the upper electrode 42. The lower electrode 41 is equivalent to the one of the terminals of the variable resistor element 40 to be coupled to the bit line BL (a first electrode line). Meanwhile, the upper electrode 42 is equivalent to the other of the terminals of the variable resistor element 40 to be coupled to the upper electrode line PL (a second electrode line).

The variable resistor element 40 is, for example, the variable resistor element in use as the memory cell of the ReRAM. In such a case, the switching layer 43 is typically formed of transition metal oxide. Otherwise, the variable resistor element 40 may be a variable magnetoresistance element in use as the memory cell of a MRAM (Magnetic Random Access Memory). In such a case, the switching layer 43 typically has a stacked structure with a tunneling insulation film sandwiched between ferromagnetic layers.

The resistance value of the variable resistor element 40 (a value of resistance between the lower electrode 41 and the upper electrode 42) is varied by a pulse voltage applied between the lower electrode 41 and the upper electrode 42. If, for example, "a set voltage Vset" is applied between the lower electrode 41 and the upper electrode 42 such that the upper electrode 42 becomes higher in potential than the lower electrode 41, the variable resistor element 40 will be in "a low resistance state (SET state)". On the other hand, if "a reset voltage Vreset" is applied between the lower electrode 41 and the upper electrode 42 such that the lower electrode 41 becomes higher in potential than the, upper electrode 42, the variable resistor element 40 will be in "a high resistance state (RESET state)". One of the low resistance state and the high resistance state corresponds to "0", and the other of the low resistance state and the high resistance state corresponds to "1".

Figure 1:
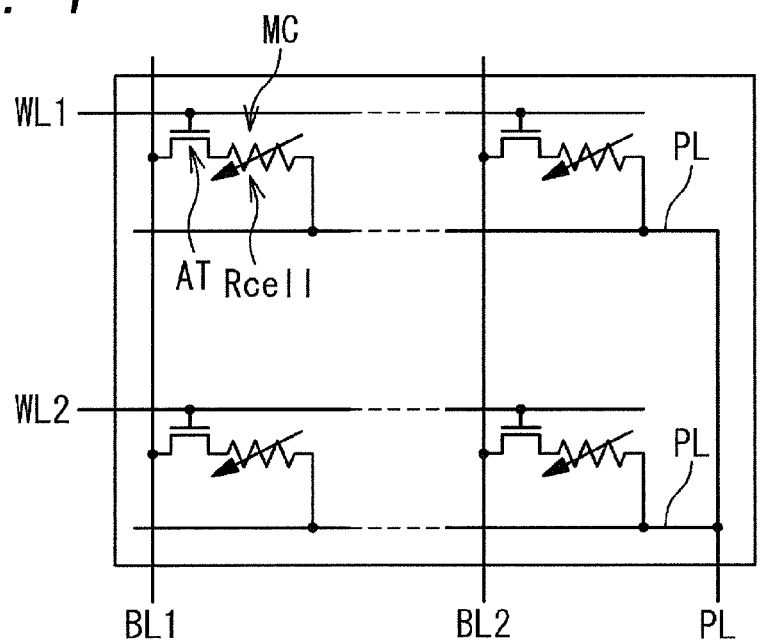
FIG. 1 is a circuit diagram showing a configuration of a memory cell array of ReRAM described in Japanese Unexamined Patent Application Publication No. 2010-257506.
Figure 2:
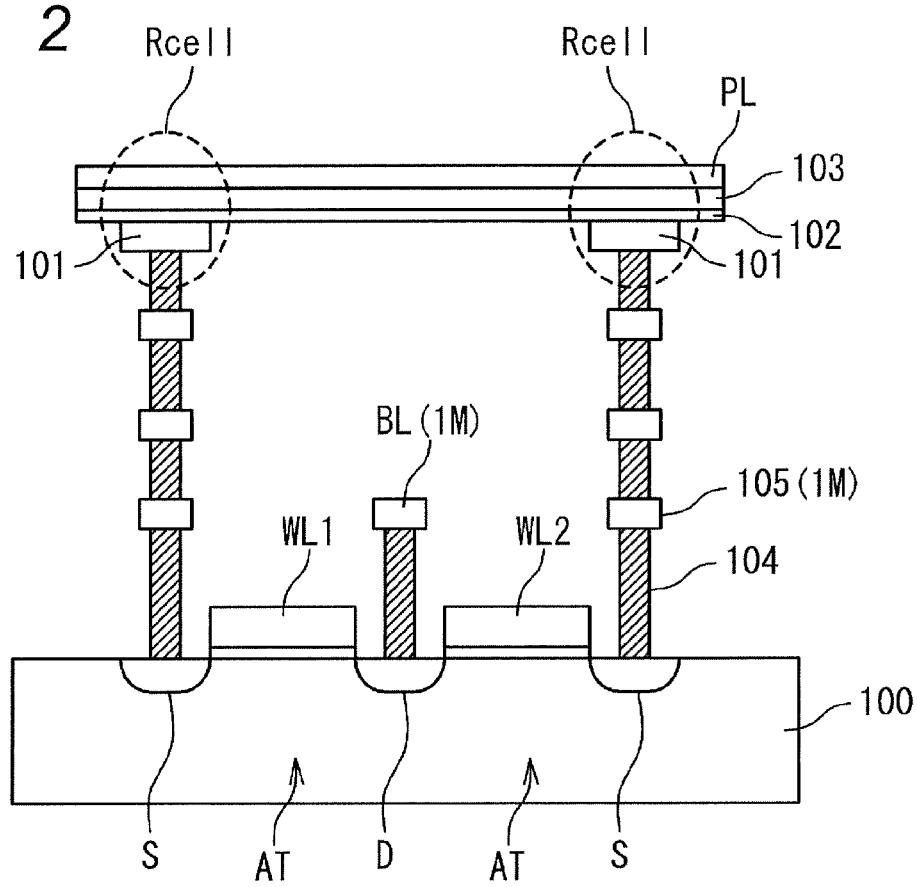
FIG. 2 is a sectional view showing a structure of the memory cell shown in FIG. 1.

FIG. 6 is a sectional view showing a structure of the memory cell array 20 according to the present embodiment of the invention. As shown in FIG. 6, the variable resistor element 40 is formed in an interconnection layer 60 above a semiconductor substrate 50. In this connection, attention should be paid to the fact that each of the memory cells MCs according to the present embodiment of the invention is not provided with an element other than the variable resistor element 40, such as the select transistor. That is, the memory cell MC (the memory cell array 20) is formed only in the interconnection layer 60 above the semiconductor substrate 50. Because the select transistor and so forth over the semiconductor substrate 50 are removed from the respective memory cells MCs, a size of the memory cell MC, that is, a macro-area of a memory becomes smaller as compared with the case of the structure already shown in FIG. 2.

The memory cell MC formed only in the interconnection layer 60 can also be expressed as follows. More specifically, a via for use in electrical coupling with a memory cell MC (the variable resistor element 40) is not formed directly underneath the memory cells MC (the variable resistor element 40). A region without the via for use in electrical coupling with the memory cell MC (the variable resistor element 40) formed directly thereunder is hereinafter referred to as "a free region RF". In the free region RF, there exists an empty space interposed between the semiconductor substrate 50 and the interconnection layer 60 with the memory cells MCs formed therein. With the present embodiment of the invention, the memory cell array 20 includes the free region RF described as above. Typically, the free region RF is present throughout a whole region of the memory cell array 20. However, the free region RF may be present only in a part of the region of the memory cell array 20. The via may be formed directly underneath, for example, some of the memory cells MCs included in the memory cell array 20.

(1-2) Operation

Next, there is described hereinafter an operation (data-rewriting, data-reading) of the variable resistance type memory 10 according to the present embodiment of the invention. Suppose the case where the memory cell MC11 in the memory cell array 20 shown in FIG. 4 is a select memory cell (subject to data-rewriting or subject to data-reading) by way of example. In this case, the bit line BL1 and the upper electrode line PL1 coupled to the select memory cell MC11 are a select bit line and a select upper electrode line PL, respectively. The bit line BL2 other than the select bit line BL1 is an unselect bit line. The upper electrode line PL2 other than the select upper electrode line PL1 is an unselect upper electrode line. FIG. 7 shows a summary of respective voltages applied to the respective bit line BLs and the respective upper electrode line PLs by the control circuit 30 (refer to FIG. 3).

(SET Operation)

Figure 8:
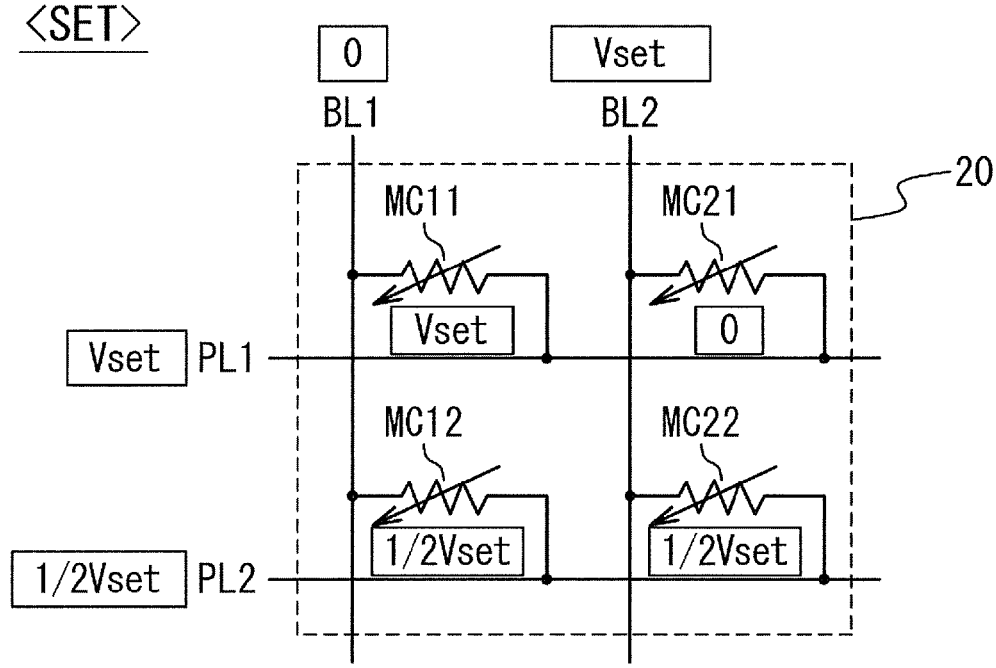
FIG. 8 is a conceptual view showing a voltage application state in the case of SET operation for setting a select memory cell to the SET operation.

In FIG. 8, there is shown a voltage application state in the case of "SET operation" for setting a select memory cell MC11 to the low resistance state (SET state). In this case, the set voltage Vset as a plus voltage is not lower than a SET threshold voltage necessary to cause the variable resistor element 40 to undergo a change to the low resistance state. Further, a half-voltage ½ Vset equivalent to about a half of the set voltage Vset is lower than the SET threshold voltage or a RESET threshold voltage described later on.

In the SET operation, a ground voltage GND is applied to the select bit line BL1, and the set voltage Vset is applied to the select upper electrode line PL1. By so doing, the set voltage V set not lower than the SET threshold voltage is applied across the respective ends of the variable resistor element 40 of the select memory cell MC11. Accordingly, the select memory cell MC11 is set to the low resistance state (SET state).

Concurrently, the set voltage V set is applied to the unselect bit line BL2, and the-half-voltage ½ V set is applied to the unselect upper electrode line PL2. In this case, a voltage applied across the respective ends of the variable resistor element 40 of the memory cell MC12 is the half-voltage ½ V set. Further, a voltage applied across the respective ends of the variable resistor element 40 of the memory cell MC21 is 0V. A voltage applied across the respective ends of the variable resistor element 40 of the memory cell MC22 is ½ Vset (a RESET direction). Accordingly, data-rewriting does not occur to the unselect memory cells MC12, MC 21, and MC22, respectively.

Furthermore, no current flows to the unselect memory cell MC 21 coupled to the select upper electrode line PL1. Accordingly, a current flowing to the select upper electrode line PL1 is only a SET current flowing to the select memory cell MC11. Accordingly, the SET current can be controlled.

(RESET Operation)

Figure 9:
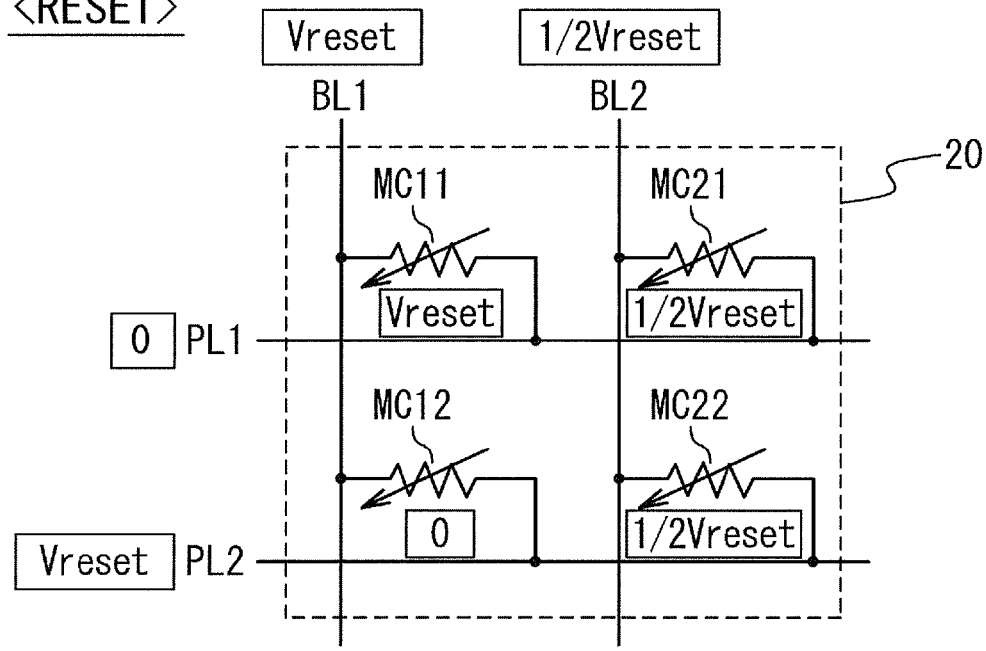
FIG. 9 is a conceptual view showing a voltage application state in the case of RESET operation for setting the select memory cell to the RESET operation.

In FIG. 9, there is shown a voltage application state in the case of "RESET operation" for setting the select memory cell MC11 to the high resistance state (RESET state). In this case, the reset voltage Vreset as a plus voltage is not lower than the RESET threshold voltage necessary to cause the variable resistor element 40 to undergo a change to the high resistance state. Further, a half-voltage ½ Vreset equivalent to about a half of a reset voltage Vreset is lower than the RESET threshold voltage or the SET threshold voltage described as above.

In the RESET operation, the reset voltage Vreset is applied to the select bit line BL1, and the ground voltage GND is applied to the select upper electrode line PL1. By so doing, the reset voltage Vreset not lower than the RESET threshold voltage is applied across the respective ends of the variable resistor element 40 of the select memory cell MC11. Accordingly, the select memory cell MC11 is set to the high resistance state (RESET state).

Concurrently, the half-voltage ½ Vreset is applied to the unselect bit line BL2, and the reset voltage Vreset is applied to the unselect upper electrode line PL2. In this case, a voltage applied across the respective ends of the variable resistor element 40 of the memory cell MC12 is 0V. Further, a voltage applied across the respective ends of the variable resistor element 40 of the memory cell MC21 is ½ Vreset. voltage applied across the respective ends of the, variable resistor element 40 of the memory cell MC22 is ½ Vreset (a SET direction). Accordingly, data-rewriting does not, occur to the unselect memory cells MC12, MC 21, and MC22, respectively.

Furthermore, no current flows to the unselect memory cell MC12 coupled to the select bit line BL1. Accordingly, current flowing to the select bit line BL1 is only a RESET current flowing to the select memory cell MC11. Accordingly, the RESET current can be controlled.

(READ Operation)

Figure 10:
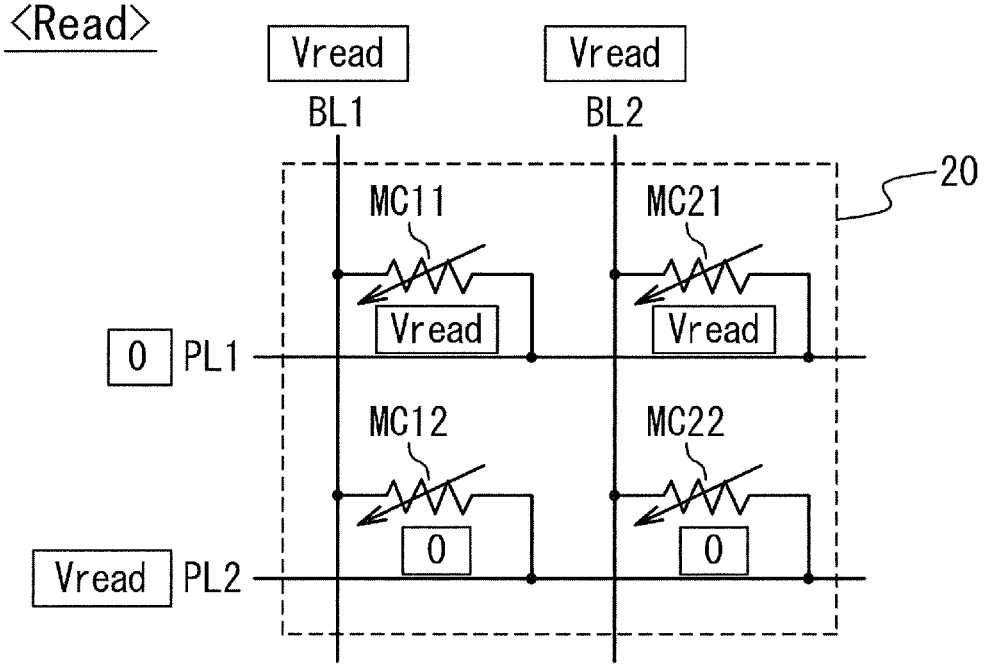
FIG. 10 is a conceptual view showing a voltage application state in the case of READ operation for setting the select memory cell to READ operation.

In FIG. 10, there is shown a voltage application state in the case of "READ operation" for reading data from the select memory cell MC11. In the READ operation, a read voltage Vread as a plus voltage is used.

More specifically, the read voltage Vread is applied to the select bit line BL1, the ground voltage GND is applied to the select upper electrode line PL1, and the read voltage Vread is applied to the unselect upper electrode line PL2. By so doing, the read voltage Vread is applied across the respective ends of the variable resistor element 40 of the select memory cell MC11, causing a cell current to flow. Meanwhile, a voltage applied to the unselect memory cell MC12 coupled to the select bit line BL1 described as above is 0V, so that the cell current does not flow. That is, a current flowing to the select bit line BL1 will be only the current flowing through the select memory cell MC11. A sense-amplifier included in the control circuit 30 determines whether the select memory cell MC11 is in the low resistance state or in the high resistance state on the basis of magnitude of the cell current flowing through the select bit line BL1, that is, the sense-amplifier reads data stored in the select memory cell MC11.

Further, the read voltage Vread may be applied to the unselect bit line BL2. In this case, a current flowing through the unselect bit line BL2 is only a cell current flowing through the unselect memory cell MC 21 as is the case with the bit line BL1. Accordingly, the sense-amplifier included in the control circuit 30 can concurrently read the data stored in the unselect memory cell MC 21, as well In the case where data from each of a plurality of the memory cells MCs is concurrently read, time required for processing of data-reading is shortened, which is preferable.

(Data-Writing to a Desired Memory Cell)

Figure 11:
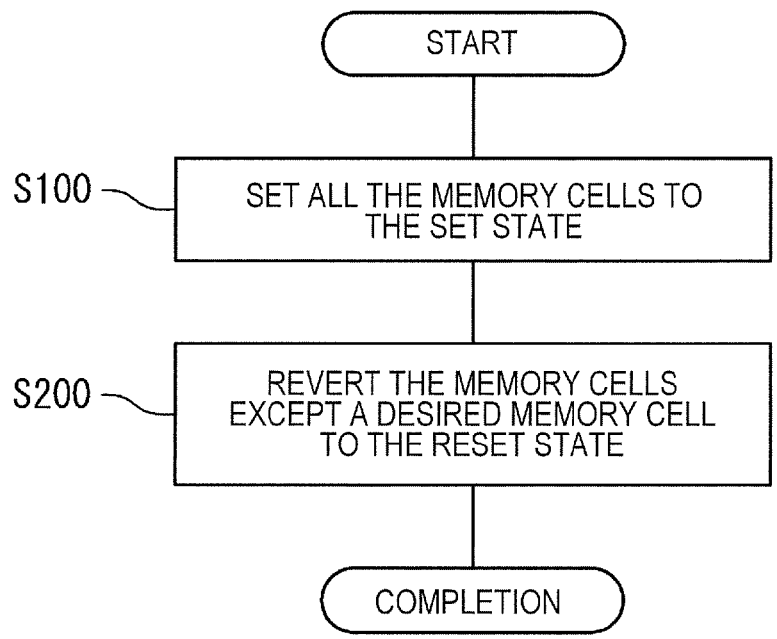
FIG. 11 is a flow chart showing a method for data-writing to a desired memory cell MC.

FIG. 11 is a flow chart showing a method for data-writing to a desired memory cell MC inside the memory cell array 20. In the data-writing, the desired memory cell MC is set to the SET state. For that purpose, the memory cells MCs included in the memory cell array 20 are first set to the SET state (step S100). Thereafter, the memory cells MCs except the desired memory cell MC are reverted to the RESET state (step S200). By so doing, only the desired memory cell MC is in the SET state.

The reason for adoption of the method for the data-writing is described as follows. In the SET operation, a voltage larger than a voltage for use at the time of the RESET operation is generally used. There is a possibility that such a large voltage as described can rewrite even the data of the unselect memory cell MC other than the select memory cell MC, that is, can trigger the so-called write disturbance. In order to preempt occurrence of the write disturbance, all the memory cells MCs are once set to the SET state before the memory cells MCs other than the desired memory cell MC are reverted to the RESET state.

(2) Semiconductor Device

Figure 12:
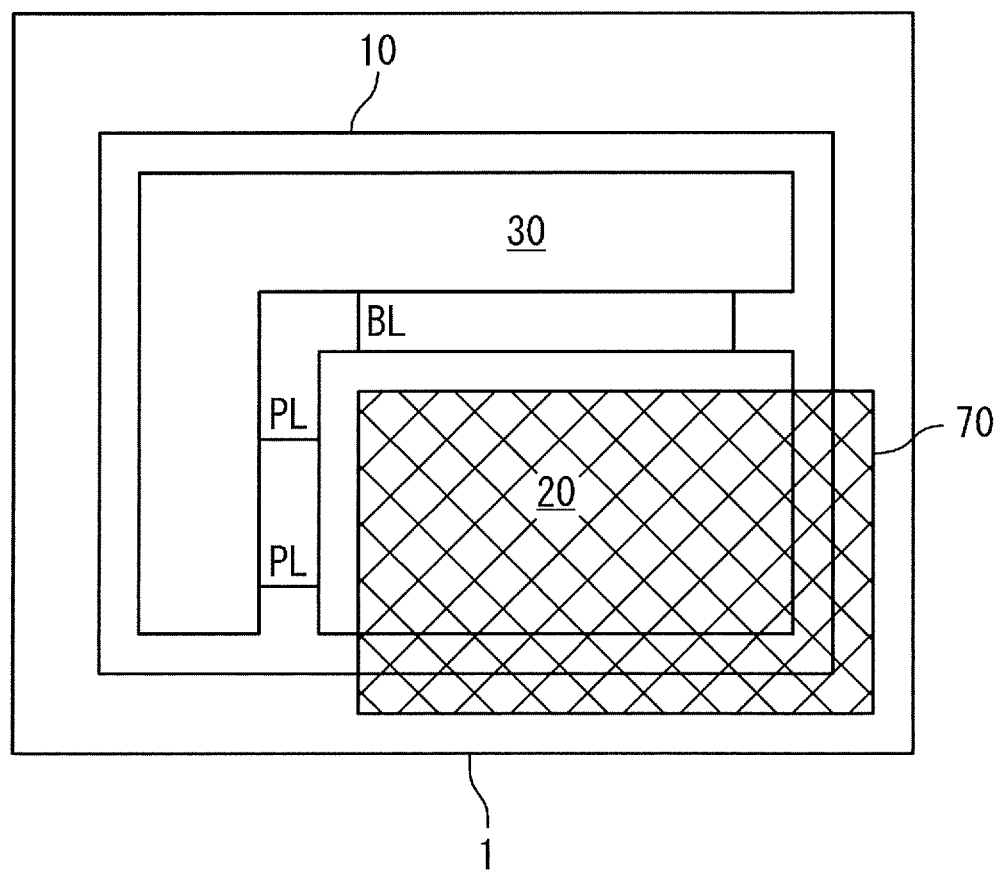
FIG. 12 is a conceptual view showing one example of a planar layout of a semiconductor device with the variable resistance type memory according to the present embodiment mounted therein.
Figure 13:
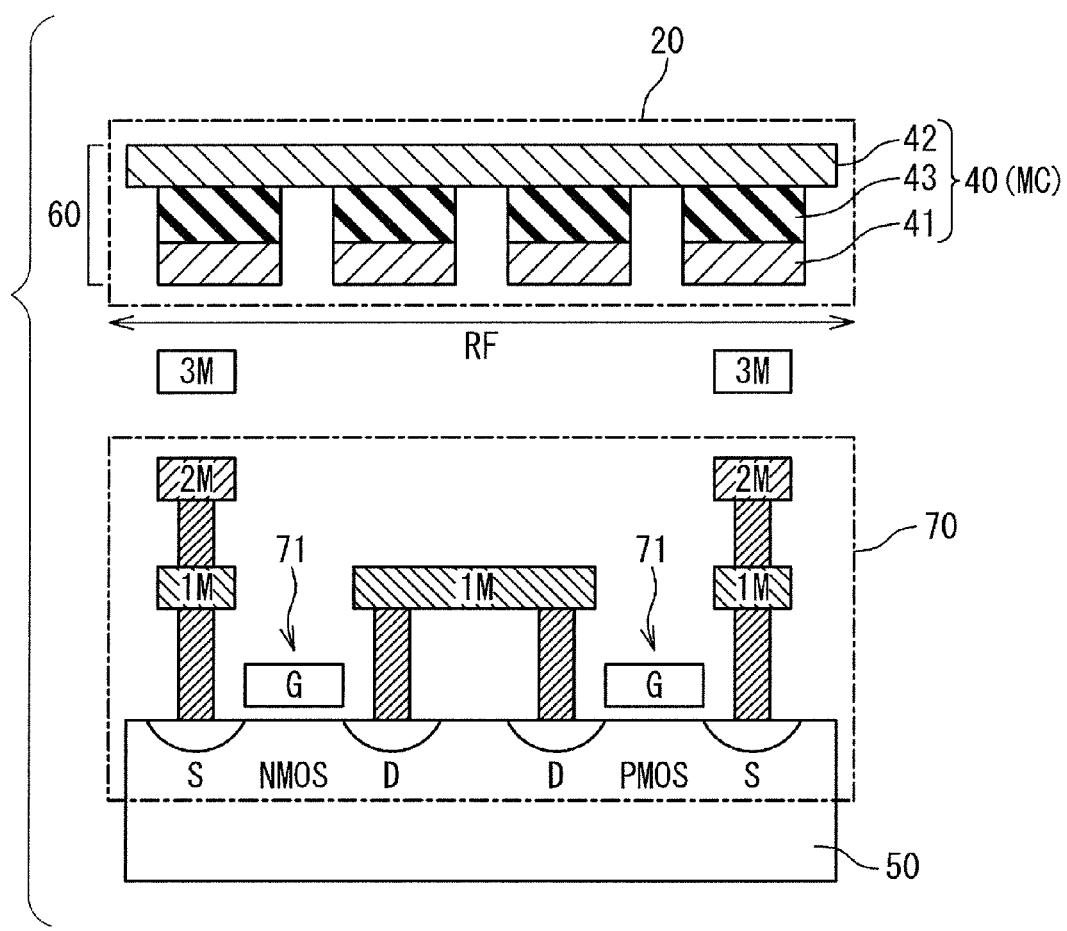
FIG. 13 is a sectional view showing one example of a structure of the semiconductor device with the variable resistance type memory according to the embodiment of the invention mounted therein.

FIG. 12 shows a planar layout of a semiconductor device 1 (semiconductor chip) with the variable resistance type memory 10 according to the present embodiment mounted therein by way of example. FIG. 13 shows a sectional structure of the semiconductor device 1.

The semiconductor device 1 (semiconductor chip) according to the present embodiment includes a lower-layer circuit 70 in addition to the variable resistance type memory 10. The lower-layer circuit 70 represents a logic circuit and an analog circuit, formed over the semiconductor substrate 50, including a transistor 71 formed over the semiconductor substrate 50. For example, the lower-layer circuit 70 includes a circuit other than the variable resistance type memory 10.

As described in Section (1) of the present specification, the free region RF is included in the memory cell array 20 of the variable resistance type memory 10 according to the present embodiment. In the free region RF, the via for use in electrical coupling with the memory cell MC is not formed directly underneath the memory cell MC. More specifically, in the free region RF, there exists an empty space interposed between the semiconductor substrate 50 and the interconnection layer 60 with the memory cells MCs formed therein. Accordingly, the lower-layer circuit 70 including the transistor 71 formed over the semiconductor substrate 50 can be disposed directly underneath the memory cell array 20 in the free region RF. Or to put it another way, the lower-layer circuit 70 is disposed in such a way as to overlap at least a part of the free region RF. Further, in a region other than the free region RF, the memory cell array 20 may be electrically coupled to the lower-layer circuit 70 through the intermediary of a via.

As described in the foregoing, with the present embodiment of the invention, the lower-layer circuit 70 is disposed in such a way as to overlap at least a part of the memory cell array 20. Accordingly, a chip area of the semiconductor device 1 (semiconductor chip) can be reduced. Reduction in the chip area is quite effective for lowering a cost.

(3) Modifications

A variety of modifications of the present embodiment are hereinafter described.

(3-1) First Modification

Figure 14:
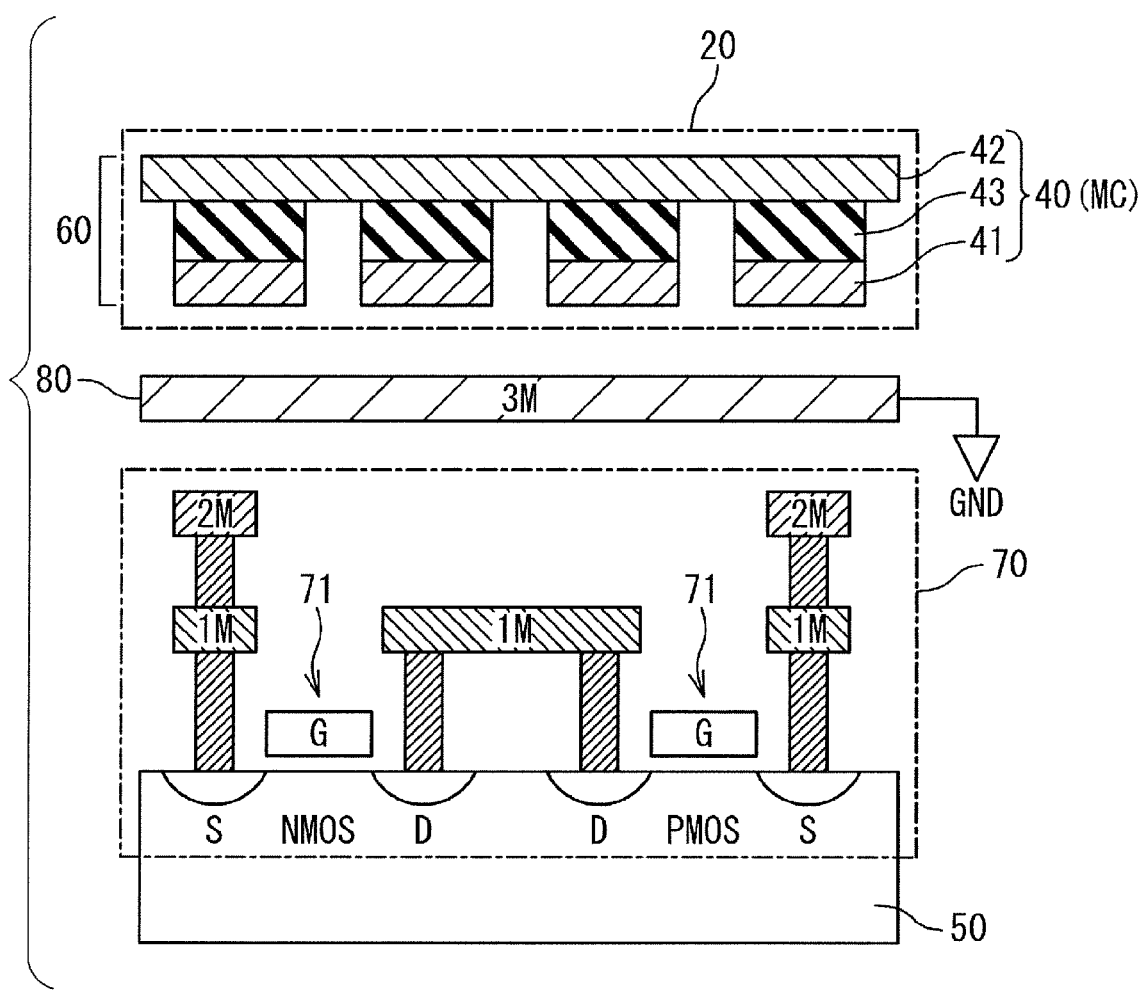
FIG. 14 is a sectional view showing a structure of semiconductor device according to a first modification of the present embodiment.

FIG. 14 is a sectional view showing a structure of the semiconductor device 1 according to a first modification of the present embodiment. With the first modification, a shield interconnection 80 is formed between the interconnection layer 60 with the memory cell array 20 formed therein and the lower-layer circuit 70. For example, the shield interconnection 80 is formed in an interconnection layer (3M) underneath the interconnection layer 60. This shield interconnection layer is fixed at a predetermined potential. The predetermined potential is, for example, a ground potential GND. Or the shield interconnection 80 may be coupled to a low-impedance power supply such as VDD, and so forth.

Due to the presence of the shield interconnection 80 described as above, it is possible to shield against noise propagation occurring between the memory cell array 20 and the lower-layer circuit 70. Propagation of noise caused by the memory cell array 20 toward the position of the lower-layer circuit 70 becomes harder to occur, so that, for example, even an analog circuit susceptible to noise can be disposed in the lower-layer circuit 70 underneath the memory cell array 20. Furthermore, because propagation of noise caused by the lower-layer circuit 70 toward the position of the memory cell array 20 becomes harder to occur, the operation of the variable resistance type memory 10 is stabilized.

(3-2) Second Modification

Figure 15:
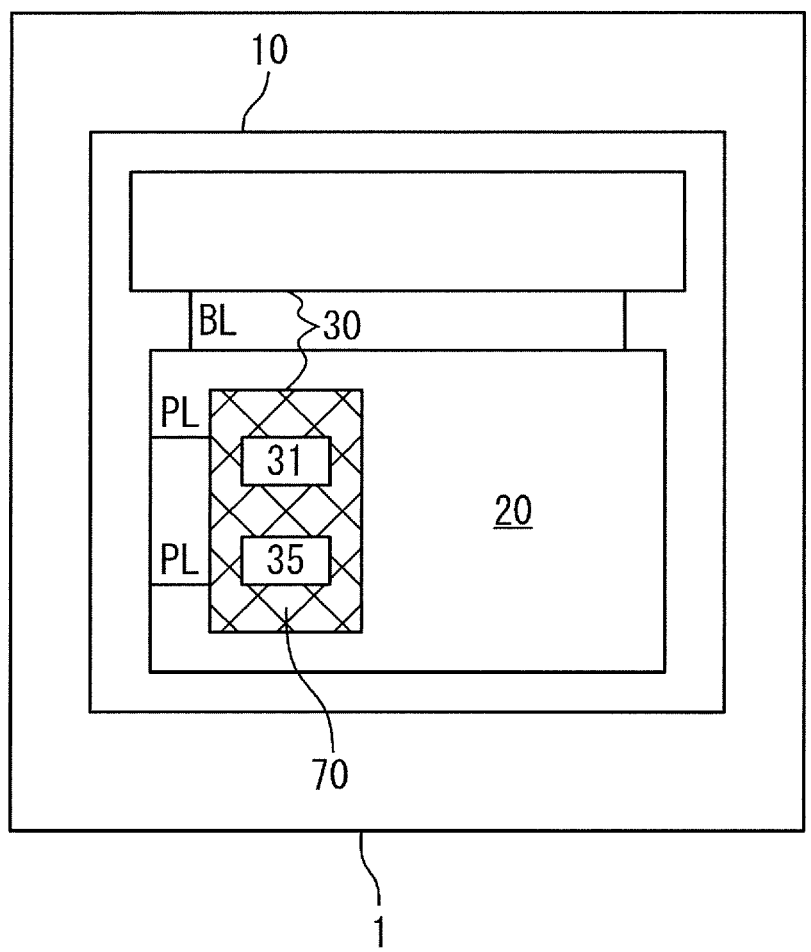
FIG. 15 is a conceptual view showing a planar layout of a semiconductor device according to a second modification of the present embodiment.

FIG. 15 shows a planar layout of a semiconductor device 1 (semiconductor chip) according to a second modification of the present embodiment. With the second modification, the lower-layer circuit 70 includes a part of the control circuit 30 of the variable resistance type memory 10. More specifically, the memory cell array 20 and the control circuit 30, belonging to the same variable resistance type memory 10, are disposed in such a way as to partially overlap each other. For example, the lower-layer circuit 70 includes the row select circuit 31 and the voltage generation circuit 35. Due to adoption of such a layout as described, the variable resistance type memory 10 can be reduced in macro-size, so that a chip size as well is reduced.

Figure 16:
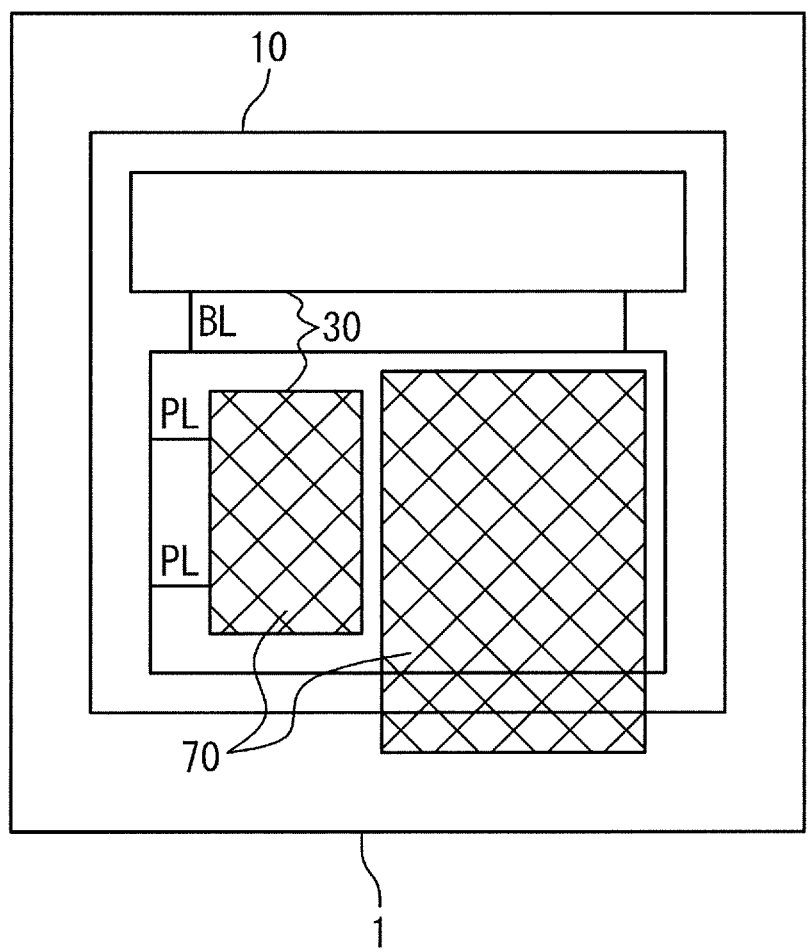
FIG. 16 is a conceptual view showing another planar layout of the semiconductor device according to the second modification.

Further, as shown in FIG. 16, the lower-layer circuit 70 may include both a part of the control circuit 30 of the variable resistance type memory 10, and a circuit other than the variable resistance type memory 10. In this case, a chip area is further reduced as compared with the case shown in FIG. 15.

(3-3) Third Modification

Figure 17:
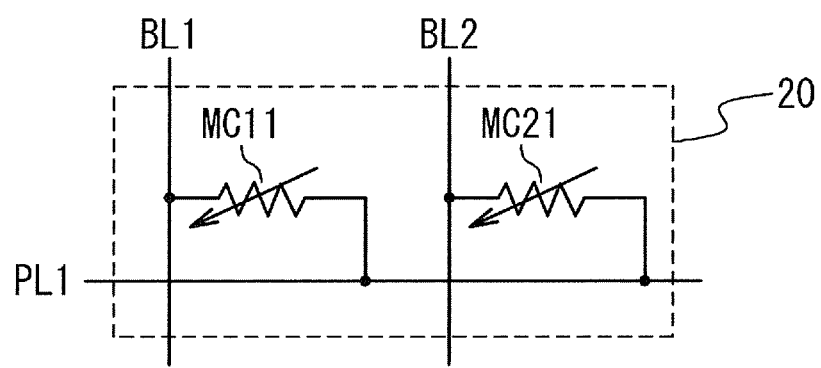
FIG. 17 is a circuit diagram showing a configuration of memory cell array according to a third modification of the present embodiment.

FIG. 17 shows a configuration of a memory cell array 20 according to a third modification. With the third modification, use is made of a 1×n memory cell array 20. More specifically, a plurality of memory cells MCs are disposed in a row direction while only one memory cell MC is disposed in a column direction. The upper electrode line PL is PL1 only.

Figures 18, 19, 20:
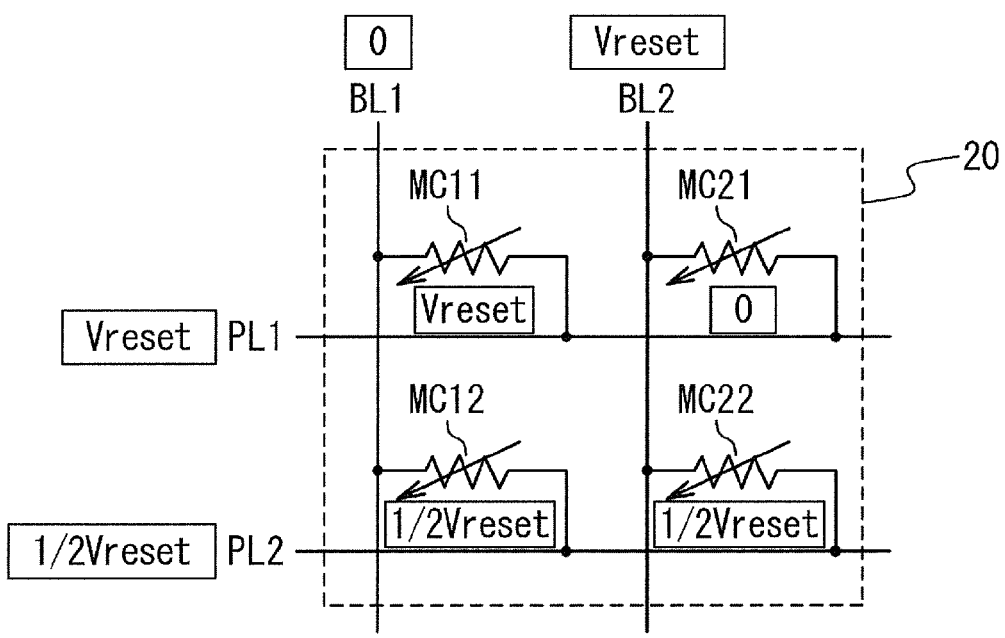
FIG. 18 is a table for describing an operation of a variable resistance type memory according to the third modification of the present embodiment of the invention.
FIG. 19 is a table for describing an operation of a variable resistance type memory according to a fourth modification of the present embodiment of the invention.
FIG. 20 is a conceptual view for describing RESET operation according to the fourth modification.

FIG. 18 shows a summary of voltages applied to the respective bit line BLs and the respective upper electrode line PLs in the case of the third modification. The present modification differs from the cases already shown in FIG. 4 and FIG. 7, respectively in that the unselect bit line BL2 is set open (Hi-Z). Because parasitic capacitance is far smaller in this case than in the case already shown in FIG. 4, even if the unselect bit line BL2 is set open, an operation speed will not be noticeably slowed down.

With the third modification, it is unnecessary to use the half-voltage (½ Vset, ½ Vreset) in order to prevent an unselect memory cell MC from turning into the SET or RESET state. Accordingly, the voltage generation circuit 35 in the control circuit 30 becomes simpler in configuration, so that the macro-size of the variable resistance type memory 10 is further reduced.

(3-4) Fourth Modification

With a fourth modification, characteristics of voltage application to the variable resistor element 40 are unipolar, in which case, the RESET operation can be implemented by applying the reset voltage Vreset (<V set) such that the upper electrode 42 is higher in potential than the lower electrode 41.

FIG. 19 shows a summary of voltages applied to the respective bit line BLs and the respective upper electrode line PLs in the case of the fourth modification. With the present modification, a voltage application state at the time of the RESET operation differs from the case already shown in FIG. 4. FIG. 20 shows a voltage application state in the case of the RESET operation according to the fourth modification.

In the RESET operation, the ground voltage GND is applied to the select bit line BL1, and the reset voltage Vreset is applied to the select upper electrode line PL1. By so doing, the reset voltage Vreset is applied across the respective ends of the variable resistor element 40 of the select memory cell MC11. Accordingly, the select memory cell MC11 is set to the high resistance state (RESET state).

Concurrently, the reset voltage Vreset is applied to the unselect bit line BL2, and the half-voltage ½ Vreset is applied to the unselect upper electrode line PL2. In this case, a voltage applied across the respective ends of the variable resistor element 40 of the memory cell MC12 is ½ Vreset. Further, a voltage applied across the respective ends of the variable resistor element 40 of the memory cell MC21 is 0V. voltage applied across the respective ends of the variable resistor element 40 of the memory cell MC22 is −½ Vreset. Accordingly, data-rewriting does not occur to the unselect memory cell MC12, MC 21, and MC22, respectively.

Furthermore, no current flows to the unselect memory cell MC 21 coupled to the select upper electrode line PL1. Accordingly, a current flowing to the select upper electrode line PL1 is only the RESET current flowing to the select memory cell MC11. Accordingly, the RESET current as well can be controlled.

(3-5) Fifth Modification

In the READ operation, the read voltage Vread is applied to the unselect upper electrode line PL2, as shown in FIG. 10 referred to early on. By so doing, a current flow toward the unselect memory cell MC12 can be prevented, and a current flowing to the select bit line BL1 is only the cell current flowing through the select memory cell MC11. Accordingly, data stored in the select memory cell MC11 can be correctly read.

Figure 21A:
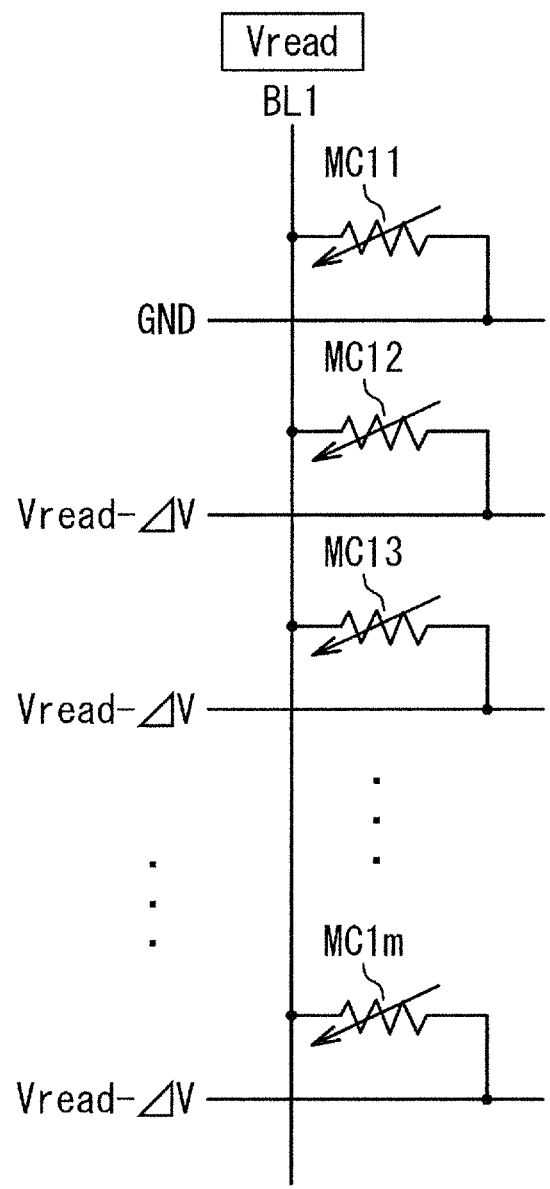
FIG. 21A is a conceptual view for use in describing a fifth modification of the present embodiment of the invention.

Now, suppose the case where an error occurs to the read voltage Vread due the effects of element variations, and so forth. Let us contemplate, for example, a situation depicted in FIG. 21A. In FIG. 21A, a select memory cell MC11, and unselect memory cells MC12 to MC1$m$ are coupled to a select bit line BL1. The read voltage Vread has been applied to the select bit line BL1. Herein, let us contemplate the case where a voltage applied to each of unselect upper electrode lines PL2 to PL$m$, coupled to the unselect memory cells MC12 to MC1$m$, respectively, becomes a voltage Vread−ΔV, which is lower than the read voltage Vread by ΔV. In this case, a current will flow to each of the unselect memory cells MC12 to MC1$m$, as well. A total of the respective currents flowing to the unselect memory cells MC12 to MC1$m$ is hereinafter referred to as "a noise current." A current flowing to the select bit line BL1 increases from the cell current flowing through the select memory cell MC11 by magnitude corresponding to the noise current. This will give an adverse effect on the data-reading from the select memory cell MC11.

Figure 21B:
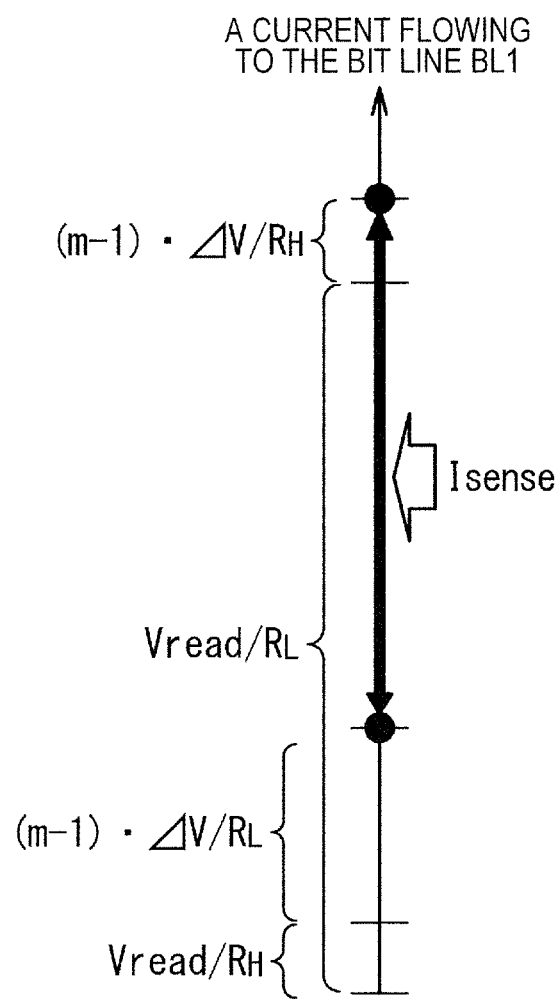
FIG. 21B is another conceptual view for use in describing the fifth modification of the present embodiment of the invention.

Referring to FIG. 21B, a margin of determination criterion on a cell current is described hereinafter. If the select memory cell MC11 is in the high resistance state, the cell current flowing through the select memory cell MC11 is Vread/RH (RH is a resistance value of the variable resistor element 40 in the high resistance state). On the other hand, if the select memory cell MC11 is in the low resistance state, the cell current flowing through the select memory cell MC11 is Vread/RL (RL is a resistance value of the variable resistor element 40 in the low resistance state). Accordingly, the margin of the determination criterion without the presence of the noise current is Vread/RL−Vread/RH. A sense current Isense for use in data determination is preferably set to (Vread/RL+Vread/RH)/2, representing an intermediate value of the margin of the determination criterion.

On the other handy if the noise current is present, the minimum value of the noise current is (m−1)×ΔV/RH, and maximum value thereof is (m−1)×ΔV/RL. A worst-case margin of the determination criterion will result in the case where the noise current will be at the maximum value $(m-1)\times\Delta V/RL$ when the cell current is relatively small at Vread/RH while the noise current will be at the minimum value $(m-1)\times\Delta V/RH$ when the cell current is relatively large at Vread/RL. In this case, the margin of the determination criterion is (Vread/RL+$(m-1)\times\Delta V/RH$)−(Vread/RH+$(m-1)\times\Delta V/RL$) =Vread/RL−Vread/RH−$(m-1)\times\Delta V\times(1/RL-1/RH)$, obviously smaller than that in the case where no noise current is present. Further, there is the need for the sense current Isense meeting a condition of [Vread/RH+$(m-1)\times\Delta V/RL$<Isense<Vread/RL+$(m-1)\times\Delta V/RH$]. The sense current Isense is preferably set to (Vread/RH+Vread/RL+$(m-1)\times\Delta V/RL$+$(m-1)\times\Delta V/RH$)/2, representing the intermediate value of the margin of the determination criterion.

Figure 22:
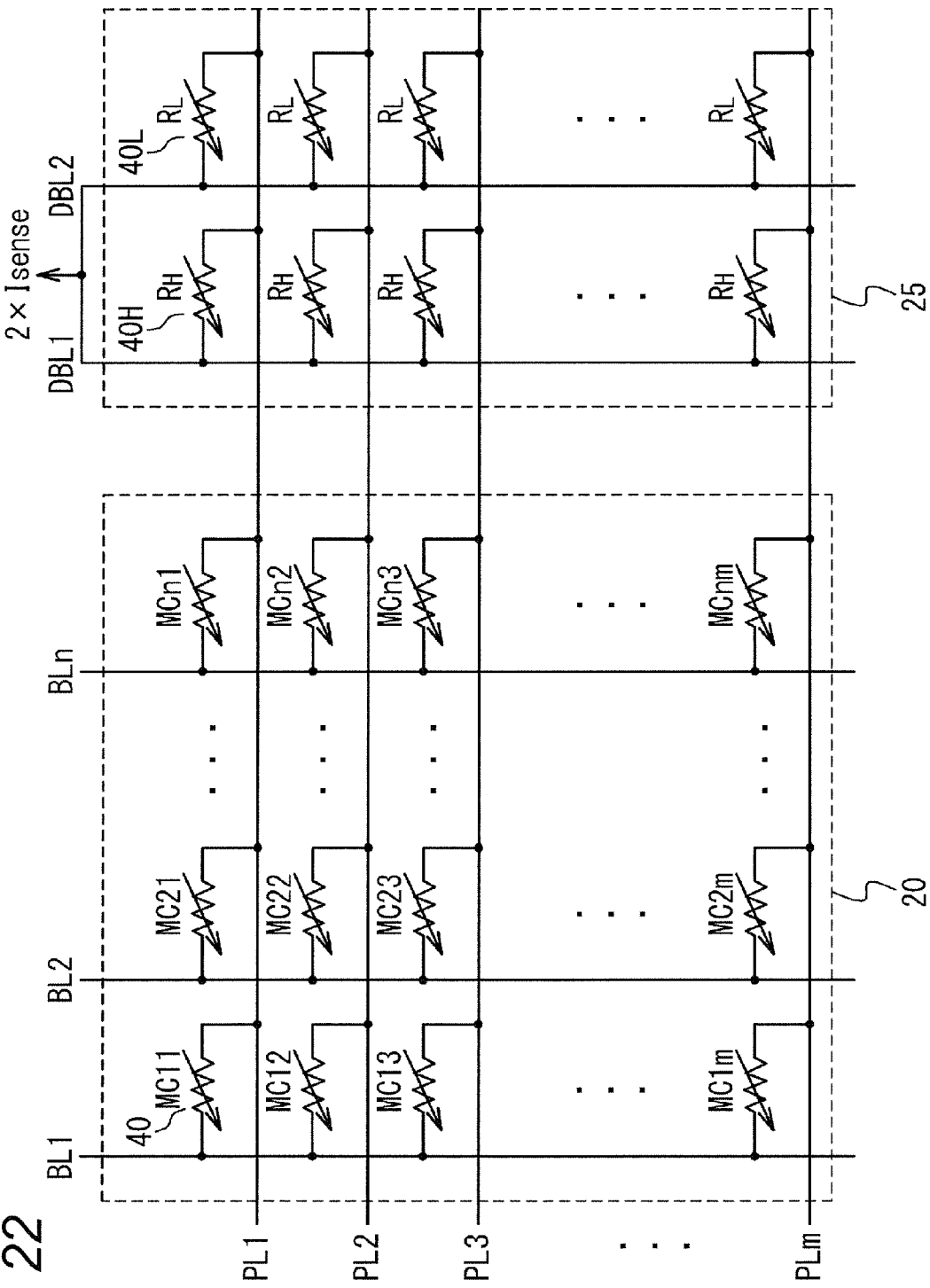
FIG. 22 is a circuit diagram showing a configuration of a cell array according to the fifth modification of the present embodiment.

With the present modification, in order to generate the sense current Isense described as above, use is made of a dummy cell array 25 shown in FIG. 22. The dummy cell array 25 includes m rows of variable resistor elements 40H, and m-rows of variable resistor elements 40L. More specifically, m pieces of the variable resistor elements 40H are each coupled between a first dummy bit line DBL1 and each of m upper electrode lines PL1 to PLm. The variable resistor element 40H is a variable resistor element 40 fixed in the high resistance state. Further, m pieces of the variable resistor elements 40L are each coupled between a second dummy bit line DBL2 and each of the m upper electrode lines PL1 to PLm. The variable resistor element 40L is a variable resistor element 40 fixed in the low resistance state. Furthermore, the first dummy bit line DBL1 and the second dummy bit line DBL2 are coupled to each other.

At the time of the data-reading, the read voltage Vread is applied to the first dummy bit line DBL1 and the second dummy bit line DBL2, respectively. The ground voltage GND is applied to the select upper electrode line PL1, and the read Voltage Vread is applied to each of the unselect upper electrode lines PL2 to PLm. If the noise current does not occur, a first dummy current Vread/RH flows to the first dummy bit line DELL and a second dummy current Vread/RL flows to the second dummy bit line DBL2. Accordingly, a total dummy current amounts to (Vread/RL+Vread/RH). The preferable sense current Isense (=Vread/RL+Vread/RH)/2, described as above, can be obtained by halving the total dummy current.

Then, suppose the case where the voltage applied to each of the unselect upper electrode lines PL2 to PLm is Vread−ΔV, as shown in FIG. 21A, causing the noise current to occur. In this case, (the first dummy current Vread/RH+$(m-1)\times\Delta V/RH$) flows to the first dummy bit line DBL1, and (the second dummy current Vread/RL+$(m-1)\times\Delta V/RL$) flows to the second dummy bit line DBL2. Accordingly, a total dummy current amounts to (Vread/RH+Vread/RL+$(m-1)\times\Delta V/RL$+$(m-1)\times\Delta V/RH$). The preferable sense current Isense (=Vread/RH+Vread/RL+$(m-1)\times\Delta V/RL$+$(m-1)\times\Delta V/RH$)/2, described as above, can be obtained by halving the total dummy current.

Thus, with the present modification, even if the noise current occurs due the effects of element variations, and so forth, the preferable sense current Isense can be generated by virtue of the dummy cell array 25. Accordingly, data can be accurately read from the select memory cell.

Figure 23A:
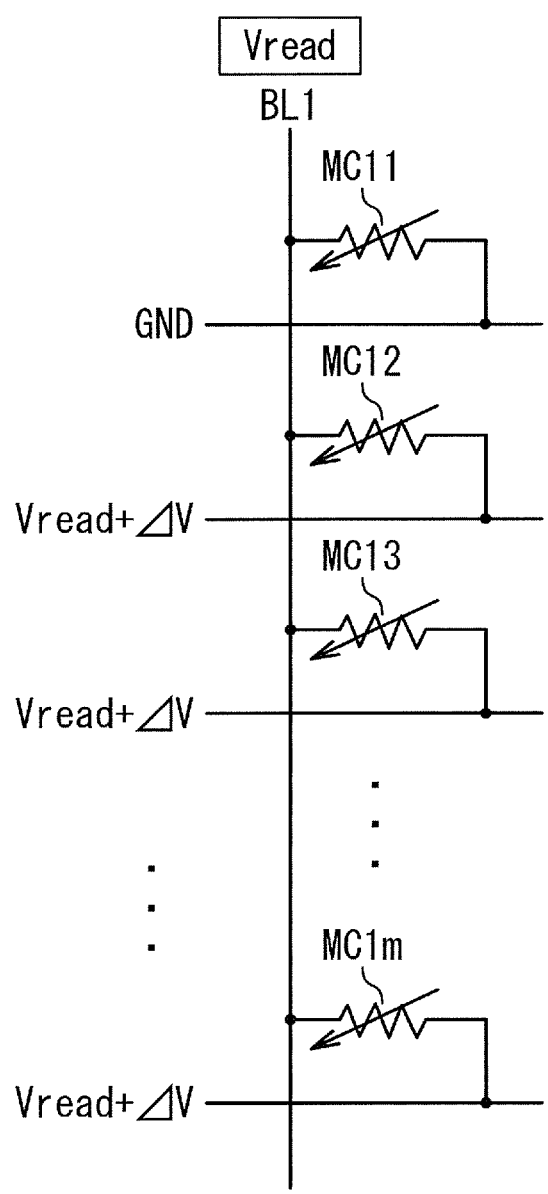
FIG. 23A is still another conceptual view for use in describing the fifth modification of the present embodiment of the invention.
Figure 23B:
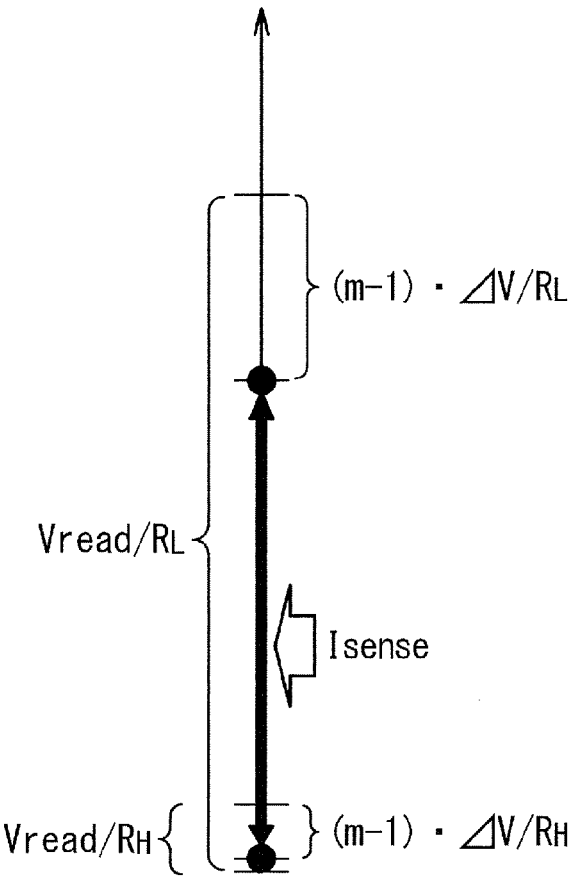
FIG. 23B is a further conceptual view for use in describing the fifth modification.

FIGS. 23A, 23B each show the case where a voltage applied to each of the unselect upper electrode lines PL2 to PLm is Vread+ΔV, higher than the read voltage Vread by ΔV. In this case, a current flowing to the select bit line BL1 will decrease from the cell current flowing through the select memory cell MC11 by magnitude corresponding to the noise current. A worst-case margin of the determination criterion is (Vread/RL−$(m-1)\times\Delta V/RL$)−(Vread/RH−$(m-1)\times\Delta V/RH$) =Vread/RL−Vread/RH−$(m-1)\times\Delta V\times(1/RL-1/RH)$, obviously smaller than that in the case where no noise current is present. In this case, a preferable sense current Isense is (Vread/RH+Vread/RL−$(m-1)\times\Delta V/RL$−$(m-1)\times\Delta V/RH$)/2, representing the intermediate value of the margin of the determination criterion. The sense current Isense described as above can be similarly generated by virtue of the dummy cell array 25. Accordingly, data can be accurately read from the select memory cell.

(3-6) Sixth Modification

Figure 24:
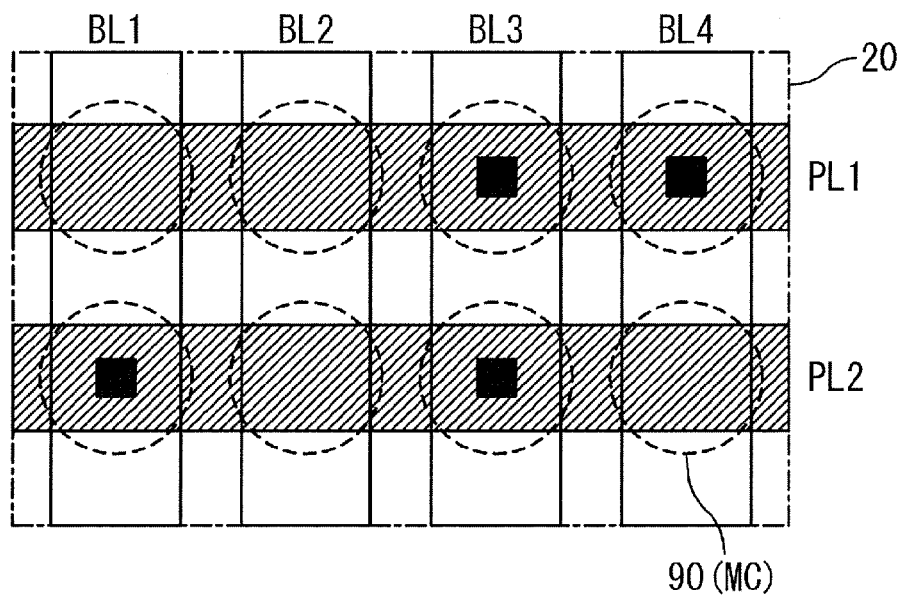
FIG. 24 is a plan view showing a configuration of a memory cell array according to a sixth modification of the present embodiment of the invention.
Figure 25:
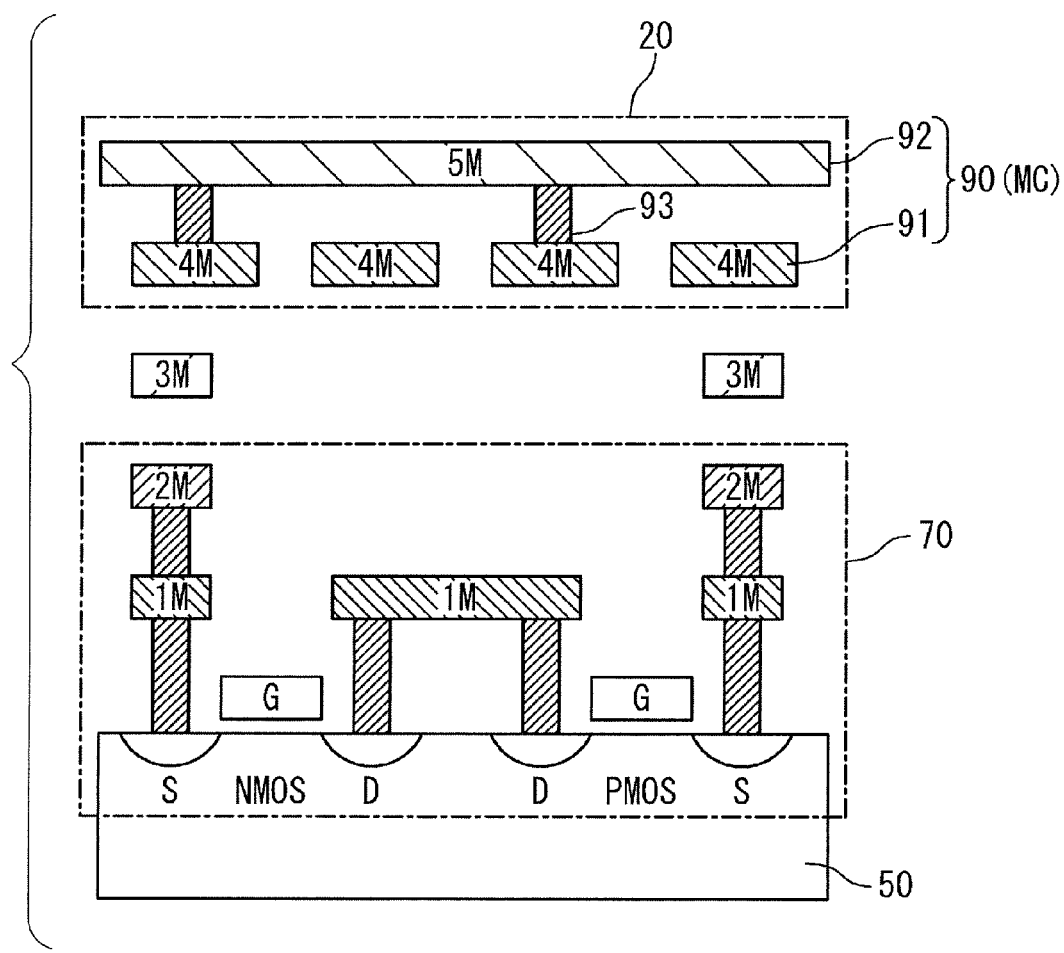
FIG. 25 is a sectional view showing a structure of a semiconductor device according to the sixth modification.

With a sixth modification, a ROM (Read Only Memory) is used in place of the variable resistance type memory 10. FIG. 24 is a plan view showing a configuration of a memory cell array 20 of the ROM according to the sixth modification. FIG. 25 is a sectional view showing a structure of a semiconductor device with the ROM mounted therein.

With the present modification, the memory cell array 20 includes a plurality of ROM elements 90 disposed in a matrix fashion. Data is stored in each of the ROM elements 90 on the basis of whether or not a via is present between a pair of electrodes. More specifically, the respective ROM elements 90 are provided with a lower electrode 91 (a bit line BL) and an upper electrode 92 (an upper electrode line PL). There is also the case where the ROM element 90 is further provided with a via 93 for use in electrical coupling between the lower electrode 91 and the upper electrode 92. The presence or absence of the via 93 corresponds to data "1" or "0".

With the present modification as well, the memory cell array 20 is formed only in the interconnection layer 60 positioned above the semiconductor substrate 50. Accordingly, the lower-layer circuit 70 can be disposed underneath the memory cell array 20.

Having described various embodiments of the invention with reference to the accompanying drawings, as above, it is our intention that the invention is not limited thereto, and that various changes and modifications may be made in the invention without departing from the spirit and scope thereof.

What is claimed is:

1. A semiconductor device comprising:
    a lower-layer circuit including a transistor formed over a semiconductor substrate; and
    a memory cell array formed in an interconnection layer above the semiconductor substrate, respective memory cells of the memory cell array including a variable resistor element formed in the interconnection layer serving as a memory element,
    wherein the memory cell array includes a first region directly underneath the memory cell, the first region being a region where a via for electrical coupling with the memory cell is not formed, and
    wherein the lower-layer circuit is disposed in such a way as to overlap at least a part of the first region.

2. The semiconductor device according to claim 1, wherein the respective memory cells include neither a select transistor nor a diode.

3. The semiconductor device according to claim 1, further comprising a shield interconnection formed between the interconnection layer with the memory cell array formed therein and the lower-layer circuit.

4. The semiconductor device according to claim 1, further comprising a variable resistance type memory,
    wherein the variable resistance type memory includes the memory cell array, and a control circuit for performing data reading/writing for the memory cell array.

5. The semiconductor device according to claim 4, wherein the lower-layer circuit includes a circuit other than the variable resistance type memory.

6. The semiconductor device according to claim 4, wherein the lower-layer circuit includes a part of the control circuit.

7. The semiconductor device according to claim 4,
wherein either end of the variable resistor element of each of the memory cells is coupled to a first electrode line, and a second electrode line, respectively,
wherein a memory cell subject to data-rewriting, within the memory cell array, is a select memory cell,
wherein the first electrode line and the second electrode line, coupled to the select memory cell, are a select first electrode line and a select second electrode line, respectively,
wherein the first electrode line other than the select first electrode line is an unselect first electrode line,
wherein the second electrode line other than the select second electrode line is an unselect second electrode line,
wherein the control circuit applies a first voltage to the select first electrode line, a second voltage to the select second electrode line, a third voltage to the unselect first electrode line, and a fourth voltage to the unselect second electrode line at the, time of the data-rewriting to the select memory cell,
wherein a difference between the first and second voltages is not lower than a threshold voltage necessary for the data-rewriting,
wherein a difference between the first and fourth voltages is lower than the threshold voltage,
wherein a difference between the second and third voltages is lower than the threshold voltage, and
wherein a difference between the third and fourth voltages is lower than the threshold voltage.

8. The semiconductor device according to claim 1,
wherein the memory cell array includes a select memory cell and at least one unselect memory cell;
wherein a first end of the variable resistor element of the select memory cell is directly connected to a first select electrode line, and a second end of the variable resistor element of the select memory cell is directly connected to a second select electrode line;
wherein a first end of the variable resistor element of the unselect memory cell is directly connected to a first unselect electrode line, and a second end of the variable resistor element of the unselect memory cell is directly connected to a second unselect electrode line; and
wherein the select data memory cell is subject to data writing.

9. The semiconductor device according to claim 8,
wherein, at a time of data writing to the select memory cell, a first voltage is applied to the first select electrode line, a second voltage is applied to the second select electrode line, a third voltage is applied to the first unselect electrode line, and a fourth voltage is applied to the second unselect electrode line;
wherein a voltage difference between the first and second voltages is not lower than a threshold voltage for data writing;
wherein a voltage difference between the first and fourth voltages is lower than the threshold voltage;
wherein a voltage difference between the second and third voltages is lower than the threshold voltage; and
wherein a voltage difference between the third and fourth voltages is lower than the threshold voltage.

* * * * *